United States Patent [19]

Fleischer et al.

[11] Patent Number: 4,783,359
[45] Date of Patent: Nov. 8, 1988

[54] ELECTRONIC SIGNAL TIME DEALY DEVICE AND METHOD OF MAKING THE SAME

[75] Inventors: Cathy A. Fleischer, Thompson; Richard T. Traskos, Brooklyn, both of Conn.

[73] Assignee: Rogers Corporation, Rogers, Conn.

[21] Appl. No.: 932,180

[22] Filed: Nov. 18, 1986

[51] Int. Cl.⁴ .................. B32B 3/00; H05K 1/00; H02H 5/04

[52] U.S. Cl. ...................... 428/209; 428/421; 428/901; 174/68.5; 361/104; 361/119; 361/124

[58] Field of Search ............... 428/36, 209, 421, 901; 174/68.5; 361/104, 119, 124

[56] References Cited

U.S. PATENT DOCUMENTS 4,303,959 12/1981 Roberts et al. ............... 361/124
4,376,927 3/1983 McGalliard ................. 174/68.5

*Primary Examiner*—John E. Kittle
*Assistant Examiner*—P. J. Ryan
*Attorney, Agent, or Firm*—Fishman, Dionne & Cantor

[57] ABSTRACT

A preferably low dielectric constant polymeric bonding layer is applied or bonded (i.e., laminated or coated) to at least one side of a preferably low dielectric constant polymeric delay line substrate. Preferably, the melting or softening point of the bonding film is lower than the melting or softening point of the substrate so that the application (e.g. lamination) step is carried out at a temperature which is above the softening point of the bonding film, but below the softening point of the substrate (thereby insuring the integrity of the delay line circuit). Thereafter, the delay line/bonding layer assembly is rolled up and head sealed so as to melt the bonding layer, thus heat sealing the delay line package. As the package heats up (in, for example, a tightly fitting die), the materials expand and provide sufficient pressure to bond the circuit together.

15 Claims, 5 Drawing Sheets

IN GND OUT

IN GND OUT

IN GND OUT

IN  OUT
GND

IN  OUT
GND

ELECTRONIC SIGNAL TIME DEALY DEVICE AND METHOD OF MAKING THE SAME

BACKGROUND OF THE INVENTION

This invention relates to the field of electronic signal timing delay devices. More particularly this invention relates to a new and improved bonding layer utilized in conjunction with a rolled electronic component suitable for use on a printed wiring board and which is capable of adjusting the arrival time of signals in high speed logic systems (time delay line).

It is well known in the electronic circuitry art that for a digital network to function correctly, certain logic variables must change state at accurately controlled points in time relative to one another. As a consequence, the precise control of signals is an important concern in printed circuit board (PCB) or wiring board (PWB) design. This concern has become especially critical with the advent of high speed digital logic networks.

Time delay lines are used in the electronics industry to adjust the timing of electronic signals. U.S. patent application Ser. Nos. 760,818 (now U.S. Pat. No. 4,675,625) and 761,007, (now U.S. Pat. No. 4,675,627, assigned to the assignee hereof, all of the contents of which are incorporated herein by reference, relate to such electronic signal time delay devices. The signal path delay devices of U.S. Pat. Nos. 4,675,627 and 4,675,627 made by forming a laminate of highly conductive are made by forming a laminate of highly conductive metal bonded to a thin, flexible dielectric film. The metal is deposited or etched so as to produce a pattern consisting of a signal line in a ground shield. The signal line is preferably serpentine (i.e., zig-zags) and makes one or more passes back and forth on the dielectric film. A ground plane is also provided via the conductive metal and surrounds the signal line, separated thereby by a small gap on both sides of the line. Two Pads or other means are provided at the ends of the signal line to interconnect the same with the circuit in which it is used. This coplanar flexible circuit is then rolled up tightly into a cylindrical shape. Significantly, the serpentine pattern of the signal line must be designed so that when the flexible circuit is rolled up, the signal line will overlap the ground plane of the next layer (not the signal line of the next layer). While there will be some overlap of the signal lines, such overlap should be at right angles and with a minimal break in the ground shield. The rolled circuit has typically used adhesive to hold it together and to stabilize the effect of the dielectric. Thereafter it may be packaged and marked by a number of well known methods.

In U.S. Pat. No. 4,675,627, the delay of the delay line is substantially increased (without increasing the line length of the circuit) by utilizing a dielectric and/or adhesive having high permeability. The use of a high permeability dielectric and/or adhesive will minimize the size, cost and resistive losses of the time delay device.

The signal time delay device of the prior patent applications have many advantages and features over both currently used delay lines as well as over prior art micro strip flexible circuit delay lines. Accordingly, the signal delay devices of U.S. Pat. Nos. 4,675,625 and 4,675,627 will provide a standard electronic component to be used on high speed logic boards, which will provide an accurate fixed time delay for high speed electronic signals; this time delay being provided with minimum distortion and degradation of the delayed signal. Additionally, the delay device of the prior applications is of compact size and is extremely economical to manufacture in high volume production.

While well suited for its intended purposes, there is a perceived problem with respect to several electrical and mechanical characteristics of a delay line which has been rolled using an adhesive system such as those used conventionally in flexible circuit constructions. Electrically, such conventional adhesive systems (i.e., acrylic, epoxy or phenolic-butyral) are relatively high in dielectric constant (DK) (3.0-4.5). A lower DK is advantageous in the delay device as it allows thinner constructions and provides improved signal integrity. Also, conventional adhesives are relatively low softening temperature materials which can lead to delamination and unrolling of the delay line at solder temperature. The conventional adhesives also would degrade at significant rates with time at temperatures below the solder temperatures (e.g., 150°-260° C.) which could also lead to delamination and changed electrical performance. Any amount of delamination can change the electrical performance and can also permit solder flux and other contaminants to enter the rolled circuit leading to corrosion.

SUMMARY OF THE INVENTION

The above discussed and other problems and deficiencies of the prior art are overcome or alleviated by the improved bonding method of the present invention for use in conjunction with the time delay device such as is described in U.S. Pat. Nos. 4,675,625 and 4,675,627. In accordance with the present invention, a preferably low dielectric constant polymeric bonding layer is applied or bonded (i.e., laminated or coated) to at least one side of a preferably low dielectric constant polymeric delay line substrate. Preferably, the melting or softening point of the bonding film is lower than the melting or softening point of the delay line substrate so that the application step is carried out at a temperature which is above the softening point of the bonding film, but below the melting or softening point of the substrate (thereby insuring the integrity of the delay line circuit). Alternatively, the bonding film can have a softening temperature substantially equivalent to that of the delay line substrate. In that case, the bonding film should have a lower melt viscosity than the delay line substrate. As a consequence, the bonding layer flows significantly to seal and bond while the substrate undergoes minimal flow. Thereafter, the delay line/bonding layer assembly is rolled up and heated so as to melt the bonding layer, thus heat sealing the delay line package. As the package heats up (in for example, a tightly fitting die), the materials expand and provide sufficient pressure to bond the circuit together.

The present invention has several electrical and mechanical advantages over prior art adhesive systems. For example, the dielectric constant and loss of the bonding film is close to that of the base material resulting in lower electrical signal distortion in the delay device. The bonding film also tends to fill in air gaps for more uniform transmission characteristics. In addition, the resulting circuit has excellent resistance to soldering heat (i.e. the delay line does not unroll after exposure to 260° C. solder) and is hermetically sealed to exclude water and contaminants.

The above-discussed and other features and advantages of the present invention will be apparent to and understood by those skilled in the art from the accompanying detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
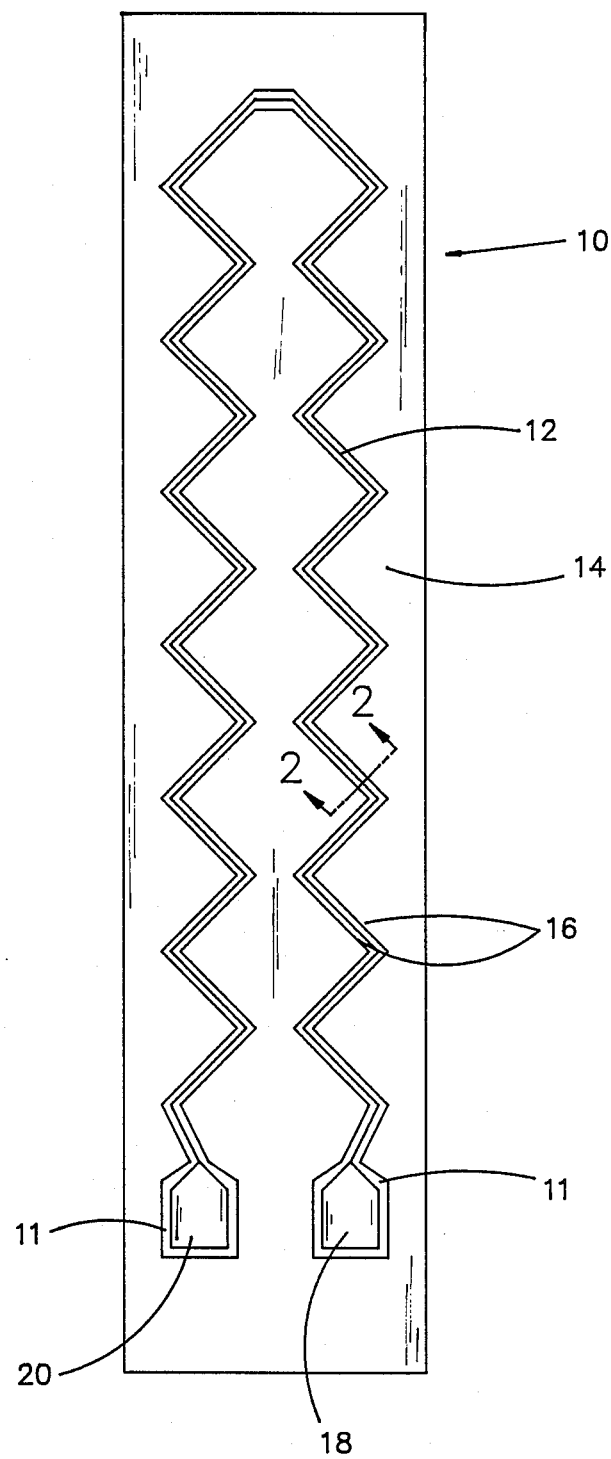
FIG. 1 is a plan view of an electronic time delay line in accordance with the present invention.
Figure 2:
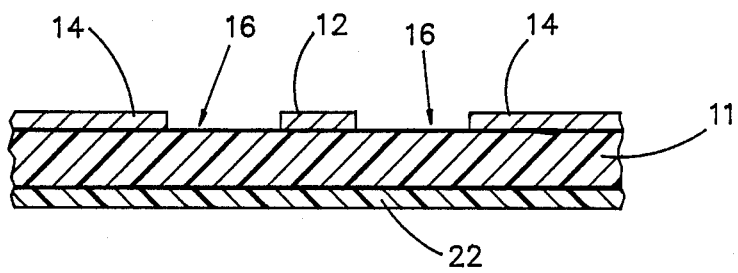
FIG. 2 is a cross-sectional elevation along the line 2—2 of FIG. 1.

Referring first to FIGS. 1 and 2, a circuit assembly used in forming an electronic signal time delay device in accordance with the present invention is shown generally at 10. Circuit 10 is comprised of a highly conductive metal bonded to a thin flexible dielectric film or substrate 11. This substrate is preferably a low dielectric constant thermoplastic material (DK between about 2 to about 2.9) such as a thin (between about 1 to about 10 mils) dimensionally stabilized glass reinforced fluoropolymer which has a high melting point (between about 260° C. to about 330° C.). Such a fluoropolymer/glass substrate may include polytetrafluoroethylene (PTFE); a copolymer having a tetrafluoroethylene backbone with a fully flourinated alkoxy side chain (manufactured by DuPont under the trademark Teflon PFA, and by Hoechst under the trademark TFA); a copolymer of tetrafluoroethylene and hexafluoropropylene (FEP) or a glass reinforced fluoropolymer/polyimide construction as is described in U.S. application Ser. No. 755,074, now U.S. Pat. No. 4,634,631 and U.S. application Ser. No. 755,067, now U.S. Pat. No. 4,647,508, both of which are assigned to the assignee hereof and incorporated herein by reference. The metal is deposited and etched so as to produce a circuit pattern consisting of a signal line 12 and a ground shield 14. Preferably, the signal line is serpentine (i.e., zig zags) and makes one or more passes back and forth on the dielectric substrate 11. The ground plane or shield 14 is provided over almost the entire surface of the laminate and is separated from the signal line 12 by a small gap 16 on either side thereof. A pair of terminal pads 18 and 20 are formed at the two ends of the signal lines. Pads 18 and 20 will interconnect the delay device of the present invention with the circuit in which it is to be used.

A low dielectric constant (i.e., about 2-2.9) polymeric bonding layer 22 is then applied, e.g., by lamination or by coating, preferably to the back side of substrate 11 (i.e., the side opposite ground plane 14 and signal line 12) as shown in FIG. 2. Alternatively, bonding layer 22 may be applied to the front side of circuit 10 or to both front and back sides of circuit 10. It will be appreciated that when application of bonding layer 22 is to the front side, the bonding layer either must be prevented from covering the pad area (18 and 20) of the circuit during application; or it will have to be removed from this area after application. Bonding layer 22 should be comprised of a polymeric material, preferably a low dielectric constant (2.0-2.9) thermoplastic material. Alternatively, a low dielectric constant thermosetting material may be used as a bonding layer. Examples of such a thermoset includes fluorinated epoxies such as are described in U.S. Pat. Nos. 3,852,222 and 3,872,045; and fluorinated polyimides, an example of which is marketed under the tradename THERMID FA-700 manufactured by National Starch of Bridgewater, N.J. If a thermoplastic bonding layer is utilized, the thermoplastic should be one which has a lower melting or softening point than the softening point of substrate 11. Preferably, bonding layer 22 has a melting point of between about 200° C. to about 320° C. Alternatively, the bonding film could have a softening temperature equivalent to that of the delay line substrate but with a lower melt viscosity. As a consequence, the bonding layer will flow significantly to seal and bond the delay line while the substrate will undergo minimal flow. Bonding layer 22 is preferably a fluoropolymer film such as ethylene tetrafluoroethylene (manufactured by DuPont under the tradename TEFZEL); flourinated ethylene-propylene copolymer (manufactured by DuPont under the tradename Teflon FEP); or a partially fluorinated and partially chlorinated thermoplastic polymer, (manufactured by 3M under the trade name 6700 bonding film); a copolymer of TFE and a fully fluorinated alkoxy side chain (TFA or PFA) (only if the substrate is polytetrafluoroethylene); or a micro-glass reinforced version of any of the materials (FEP, Tefzel, TFA, PFA). It will be appreciated that the bonding layer may be comprised of a filled or unfilled polymeric material. Use of a filled material may be beneficial in controlling melt flow or increasing permeability.

The application step of bonding layer 22 to substrate 11 is typically carried out at a temperature above the softening point of the bonding layer, but below the softening point of the substrate, so that the circuit pattern (i.e., signal line 12) remains intact on substrate 11.

Figure 3:
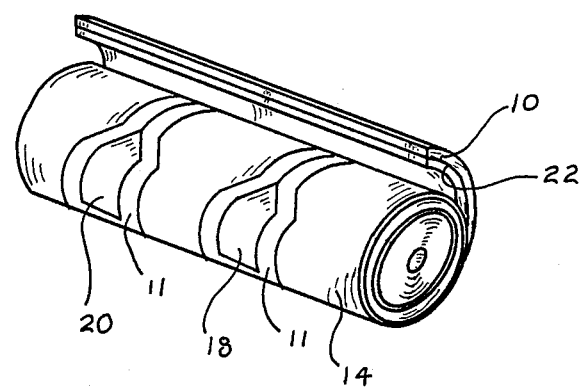
FIG. 3 is a perspective view of delay line of FIG. 1 subsequent to being rolled.
Figure 4:
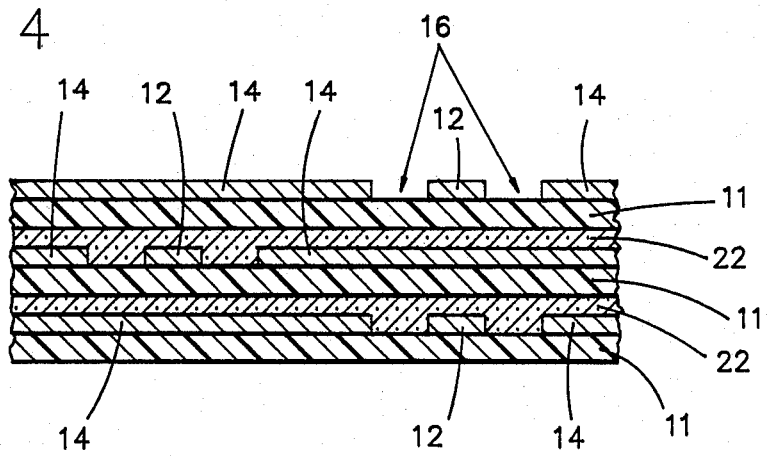
FIG. 4 is a cross-sectional elevation view through a portion of the rolled delay line of FIG. 3.
Figure 5A:
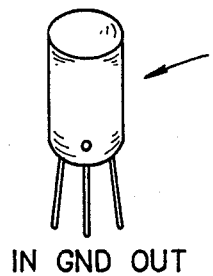
FIG. 5A-C are perspective views of packaged rolled delay lines suitable for through-hole mounting in accordance with the present invention.
Figure 5B:
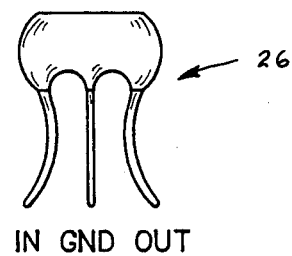
Figure 5C:
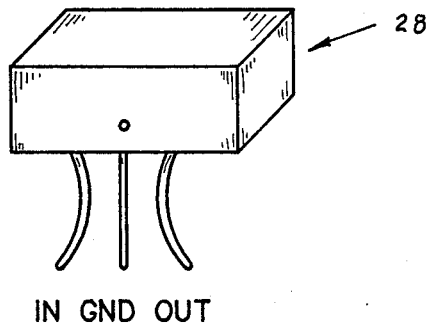
Figure 6A:
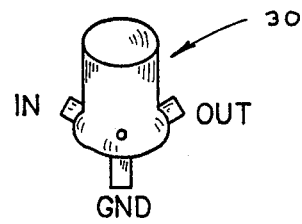
FIG. 6A-B are perspective views of packaged rolled delay lines suitable for surface mounting in accordance with the present invention.
Figure 6B:
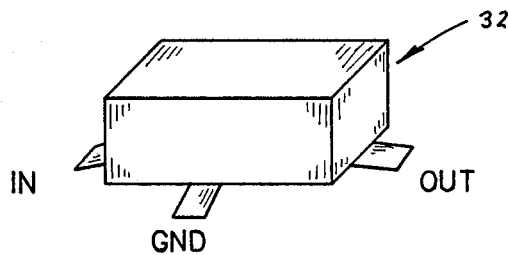

Turning now to FIGS. 3 and 4, the electronic signal delay line of the present invention is formed by tightly rolling up the coplanar flexible circuit 10 of FIG. 1 into a cylindrical or other shape. A portion of the rolled coplanar flexible circuit is shown in cross-section in FIG. 4. The rolled circuit of FIG. 3 is then heat sealed using any suitable heat sealing procedure. For example, the rolled circuit may be placed into a tight fitting die (not shown) which is then heated up to melt the bonding layer, thus heat sealing the package. As the package heats up in the tightly-fitting die, the materials expand and provide sufficient pressure to bond the circuit together. Other methods of heat sealing (besides the use of a die) would include any means which holds or retains the coil so that it does not loosen or unravel during the heating and cooling steps. Such retaining means may include a clip for holding the coil tightly or a process which maintains tension on the outside end of the circuit. Thereafter, the bonded delay line package may be encapsulated for through-hole or surface mounting as shown, for example, at 24, 26 and 28 in FIGS. 5A-C, respectively; and at 30 and 32 in FIGS. 6A and 6B, respectively.

The method of bonding an electronic time delay line and the delay line formed thereby in accordance with the present invention provides many features and advantages over prior art bonding methods which have used conventional adhesives. For example, the dielectric constant of the substrate and bonding layers may be closely matched resulting in lower signal distortion than is possible with adhesives. Also, the polymeric bonding film tends to fill in air gaps in the rolled delay line circuit thereby achieving more uniform transmission characteristics. In addition, the resulting delay line circuit has excellent resistance to soldering heat (i.e., the delay line will not unroll after exposure to a 260° C. solder bath). Finally, at least another advantage of the present invention is the excellent hermetic sealing provided against water and other contaminants.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electronic signal time delay device for use in a circuit pattern comprising:
    coplanar flexible circuit means, said flexible circuit means including a nonconductive polymeric substrate having opposed surfaces, said substrate including electrically conductive material disposed on one of said opposed surfaces;
    said conductive material comprising a ground plane with a signal line therein, said signal line being separated from said ground plane via a gap on both sides of said signal line;
    a bonding layer disposed on at least one of said opposed surfaces, said bonding layer comprising a polymeric material having a softening temperature which is less than the softening tempurature of said polymeric substrate;
    said coplanar flexible circuit means and bonding layer having a longitudinal dimension and being rolled along said longitudinal dimension; and
    said bonded layer being heated above its softening temperature but below the softening temperature of said substrate wherein said bonding layer will flow to thereby seal and bond said rolled coplanar flexible circuit means together.

2. The device of claim 1 wherein:
    said polymeric substrate is comprised of a thermoplastic material.

3. The device of claim 2 wherein:
    said thermoplastic substrate comprises a fluoropolymer.

4. The device of claim 3 wherein:
    said fluoropolymer is selected from the group comprising polytetrafluoroethylene, a copolymer having a tetrafluoroethylene backbone with a fully fluorinated alkoxy side chain and a copolymer of tetrafluoroethylene and hexafluoropropylene.

5. The device of claim 2 wherein:
    said thermoplastic substrate has a melting temperature of between about 260° C. to about 330° C.

6. The device of claim 2 wherein:
    said thermoplastic substrate has a dielectric constant of between about 2 to about 2.9.

7. The device of claim 1 wherein:
    said polymeric bonding layer is comprised of a thermoplastic material.

8. The device of claim 7 wherein:
    said thermoplastic bonding layer comprises a fluoropolymer.

9. The device of claim 8 wherein:
    said fluoropolymer is selected from the group comprising ethylene tetrafluoroethylene, fluorinated ethylene-propylene copolymer and a copolymer having a tetrafluoroethylene backbone with a full fluorinated alkoxy side chain.

10. The device of claim 7 wherein:
    said bonding layer has a softening temperature of between about 220° C. to about 320° C.

11. The device of claim 7 wherein:
    said bonding layer has a dielectric constant of between about 2.0 to about 2.9.

12. The device of claim 1 wherein:
    the dielectric constant of the bonding layer is substantially matched with the dielectrc constant of the substrate.

13. The device of claim 1 wherein:
    said substrate is comprised of a material having a high permeability; and
    said bonding layer is comprised of a material having high permeability.

14. The device of claim 8 wherein:
    said fluoropolymer is microglass reinforced.

15. The device of claim 3 wherein:
    said fluoropolymer is glass reinforced.

* * * * *

UNITED STATES PATENT AND TRADEMARK OFFICE
CERTIFICATE OF CORRECTION

PATENT NO. : 4,783,359
DATED : November 8, 1988
INVENTOR(S) : Fleischer et al

It is certified that error appears in the above-identified patent and that said Letters Patent is hereby corrected as shown below:

In the title: change "DEALY" to -- DELAY--

Signed and Sealed this

Twenty-first Day of November, 1989

Attest:

JEFFREY M. SAMUELS

Attesting Officer     Acting Commissioner of Patents and Trademarks